United States Patent [19]
Tsay et al.

[11] Patent Number: 5,159,206
[45] Date of Patent: Oct. 27, 1992

[54] POWER UP RESET CIRCUIT

[76] Inventors: Ching-Yuh Tsay, 2408 Honeysuckle, Richardson, Collin County, Tex. 75082; Donald J. Redwine, 12118 Manorgate, Houston, Harris County, Tex. 77031

[21] Appl. No.: 561,536

[22] Filed: Jul. 31, 1990

[51] Int. Cl.[5] .......................................... H03K 17/30
[52] U.S. Cl. .............................. 307/272.3; 307/594; 307/475; 307/296.4
[58] Field of Search ................. 307/272.3, 594, 597, 307/296.4, 296.5, 475

[56] References Cited
U.S. PATENT DOCUMENTS

| | | | |
|---|---|---|---|
| 4,140,930 | 2/1979 | Tanaka | 307/272.3 |
| 4,558,234 | 12/1985 | Suzuki et al. | 307/475 |
| 4,584,492 | 4/1986 | Sharp | 307/475 |
| 4,728,829 | 3/1988 | Tsujimoto | 307/594 |
| 4,812,679 | 3/1989 | Mahabadi | 307/272.3 |
| 4,885,476 | 12/1989 | Mahabadi | 307/296.5 |
| 4,888,497 | 12/1989 | Dallabora et al. | 307/272.3 |
| 4,902,907 | 2/1990 | Haga et al. | 307/272.3 |
| 4,948,995 | 8/1990 | Takahashi | 307/272.3 |
| 4,959,560 | 9/1990 | Ootani | 307/296.4 |
| 4,970,408 | 11/1990 | Hanke et al. | 307/272.3 |

Primary Examiner—Stanley D. Miller
Assistant Examiner—Scott A. Ouellette
Attorney, Agent, or Firm—Robby T. Holland; René E. Grossman; Richard L. Donaldson

[57] ABSTRACT

A circuit to generate a power up reset pulse for a semiconductor device, such as a dynamic random access memory (DRAM) that may utilize an on chip voltage generator is disclosed. The circuit generates a positive going pulse when the external power supply ramps up. The pulse disappears when the voltage level within the device reaches a predetermined value of the external supply voltage. The circuit includes a CMOS inverter that is biased between the external voltage and ground and has its input coupled to the internally regulated voltage. The gate of a pull down transistor may couple the input of the CMOS inverter to the internally regulated voltage. A pull up transistor that is biased by the external voltage and whose gate is connected to the output of the CMOS inverter, is connected to the input of the CMOS inverter. Other elements may be added to enhance the circuits performance. The trip point of the circuit with respect to the externally supplied voltage may be adjusted by varying the relative sizes of the pull down transistor and the pull up transistor.

13 Claims, 11 Drawing Sheets

POWER UP RESET CIRCUIT

CROSS-REFERENCE TO RELATED APPLICATIONS

This application cross-references and incorporates by reference, the following simultaneously filed, co-pending and so-assigned applications of Texas Instruments Incorporated:

| Ser. No. | TI-Docket | Title |
| --- | --- | --- |
| 07/560,983 | TI-15378 | A Counter Circuit |
| 07/560,961 | TI-15379 | A Configuration Selection Circuit for a Semi-conductor Device |
| 07/560,962 | TI-15380 | A Pulse Generation Circuit |
| 07/560,541 | TI-15381 | A CMOS Single Input Buffer for Multiplexed Inputs |
| 07/560,982 | TI-15382 | A Test Validation Method for a Semi-Conductor Memory Device |
| 07/560,523 | TI-15383 | A Voltage Reference Initialization Circuit |
| 07/560,934 | TI-15384 | A Power up Detection Circuit |
| 07/560,662 | TI-15385 | A Substrate Bias Generator System |
| 07/560,542 | TI-15386 | A Voltage Level Detection Circuit |
| 07/560,720 | TI-14642 | A Circuit and Method for Two Stage Redundancy Decoding |
| 07/560,935 | TI-15389 | A Method for Initializing Redundant Circuitry |
| 07/560,646 | TI-14756 | A Voltage Drive Circuit |

FIELD OF THE INVENTION

This invention is in the field of integrated circuits, and is more specifically directed memory devices.

BACKGROUND OF THE INVENTION

The development of VLSI semi-conductor devices of the Dynamic Random Access Memory (DRAM) type is well known. Over the years, the industry has steadily progressed from DRAMS of the 16K type (as shown in the U.S. Pat. No. 4,081,701 issued to White, McAdams and Redwine), to DRAMS of the 64K type (as shown in U.S. Pat. No. 4,055,444 issued to Rao) to DRAMS of the 1MB type (as shown in U.S. Pat. No. 4,658,377 issued McElroy), and progressed to DRAMS of the 4MB type. The 16MB DRAM, wherein more than 16 million memory cells are contained on a single semiconductor chip is the next generation of DRAMS scheduled for production.

In designing VLSI semiconductor memory devices of the 16MB DRAM type, designers are faced with numerous challenges. One area of concern is power consumption. The device must be able to power the increased memory cells and the supporting circuits. However, for commercial viability, the device must not use excessive power. The power supplies used and the burn in voltage for the part must also be compatible with the thin gate oxides in the device.

Another area of concern is the elimination of defects. The development of larger DRAMS has been fostered by the reduction in memory cell geometries, as illustrated in U.S. Pat. No. 4,240,092 to KUO (a planar capacitor cell) and as illustrated in U.S. Pat. No. 4,721,987 to Bagles et. al. (a trench capacitor cell). The extremely small geometries of the 16MB DRAM will be manufactured using sub-micron technology. The reduction in feature size has meant that particles that previously did not cause problems in the fabrication process, now can cause circuit defects and device failures.

In order to ameliorate defects, redundancy schemes have been introduced. The redundancy schemes normally consist of a few extra rows and columns of memory cells that are placed within the memory array to replace defective rows and columns of memory cells. Designers need new and improved redundancy schemes in order to effectively and efficiently repair defects and thereby increase yields of 16MB DRAM chips.

Another area of concern is testing. The device must have circuits to allow for the industry standards 16× parallel tests. In addition, other circuits and test schemes are needed for internal production use to verify operability and reliability.

The options that the device should have is another cause for concern. For instance, some customers require a X1 device, while others require a X4 device. Some require an enhanced page mode of operation. Additionally, it is yet undecided whether the DRAM industry will maintain 4096-cycle refresh, or move towards a lower number of refresh cycles.

Another cause for concern is the physical layout of the chip. The memory cells and supporting circuits must fit on a semiconductor chip of reasonable size. The size of the packaged device must be acceptable to buyers.

New design strategies and circuits are required to meet the above concerns, and other concerns, relating to the development of the next generation, and to future generations, of Dynamic Random Access Memory devices.

It is an object of this invention therefore, to provide an improved circuit which will detect the power up condition for a semiconductor device and generate an output to reset circuits within the device to ensure that they power up in a known condition.

Other objects and advantages of this invention will become apparent to those of ordinary skill in the art, having reference to the following specification, together with the drawings.

SUMMARY OF THE INVENTION

A circuit to generate a power up reset pulse for a semiconductor device, such as a dynamic random access memory (DRAM) that may utilize an on chip voltage generator is disclosed. The circuit generates a positive going pulse when the external power supply ramps up. The pulse disappears when the voltage level within the device reaches a predetermined value of the external supply voltage. The circuit includes a CMOS inverter that is biased between the external voltage and ground and has its input coupled to the internally regulated voltage. The gate of a pull down transistor may couple the input of the CMOS inverter to the internally regulated voltage. A pull up transistor that is biased by the external voltage and whose gate is connected to the output of the CMOS inverter, is connected to the input of the CMOS inverter. Other elements may be added to enhance the circuits performance. The trip point of the circuit with respect to the externally supplied voltage may be adjusted by varying the relative sizes of the pull down transistor and the pull up transistor.

DETAILED DESCRIPTION OF THE PREFERRED EMBODIMENT

Figure 1:
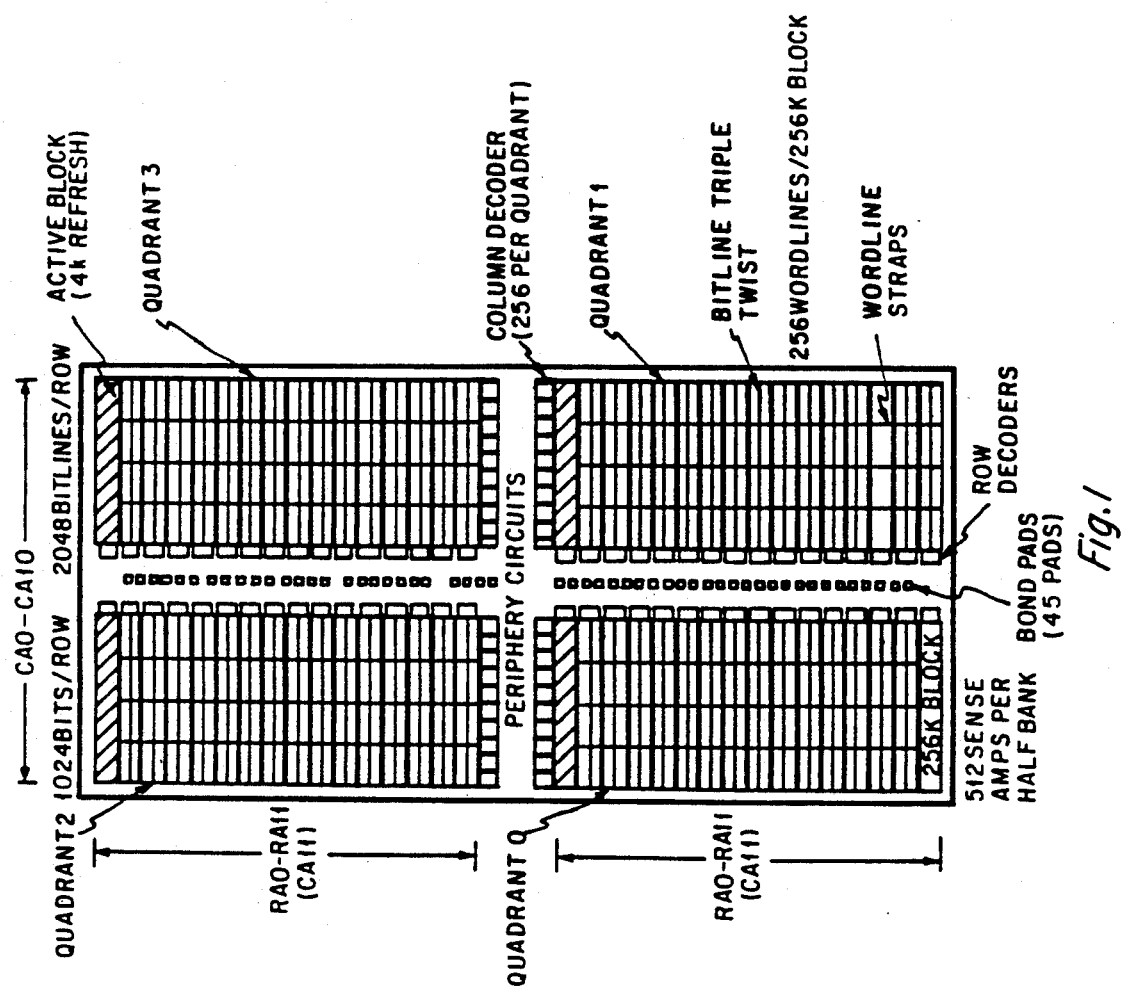
FIG. 1 is a block system level drawing illustrating a 16MB Dynamic Random Access Memory chip incorporating the preferred embodiment of the invention. Unless the figures and the structural description indicates otherwise, it is to be presumed that the circuits are biased by the voltage Vperi.

FIG. 1 illustrates a 16 Megabit Dynamic Random Access Memory Chip referred to as a 16 MB DRAM. The chip size is about 325×660 mm. The chip is partitioned into four memory array quadrants. Each memory array quadrant contains 4 Megabits. A 4 MB memory array quadrant contains 16 memory blocks. Each memory block contains 256 Kilobits. The Column Decoders lie along the vertical axis of the chip adjacent to their respective memory array quadrants. The ROW decoders lie along the horizontal axis of the chip, adjacent to their respective memory array quadrants. The periphery circuits containing such devices as the input and output buffers and the timing and control circuits are centrally located along both horizontal the vertical axis of the chip. The bond pads are centrally located along the horizontal axis of the chip.

General characteristics of the 16 MB DRAM device of FIG. 1 follow. The device receives external VDD of typically 5 volts. On chip internal voltage regulation powers the memory arrays at 3.3 volts and the periphery circuits at 4.0 volts to reduce power consumption and channel hot carrier effects. The substrate is biased at −2 volts. The organization is bond programmable X1/X4. The enhanced page mode is the main option, with a metal mask programmable option for a write per bit (data mask) operation. The main option for the refresh scheme is 4096 cycles at 64 ms. However, the DRAM is bond programmable for 2048 cycle refresh.

The DRAM has numerous design-for-test features. Test mode entry 1 is through WCBR with no address key for 16× internal parallel test with mode data compare. Test mode entry 2 is WCBR with over-voltage and address key only thereafter (8 volts on A11), Exit from test mode occurs from any refresh cycle (CBR or RAS only). Test mode entry 1 is the industry standard 16× parallel test. This test is similar to those use on the 1 MB and 4 MB DRAMS, except that 16 bits are compared simultaneously instead of 8 bits. The valid address keys are A0, A1, A2, and A6. Test mode entry 2 contains numerous tests. There is a 32× parallel test with data compare and a 16× parallel test with data compare. Different hexadecimal addresses are keyed for the different parallel tests. A storage cell stress test and a VDD margin test allows connection of the external VDD to internal VARY and VPERI through the P-channel devices. Other tests include a redundancy signature test, a row redundancy roll call test, a column redundancy roll call test, a row transfer test, a word-line leakage detection test, clear concurrent test modes, and a reset to normal mode. The DRAM also contains a test validation method that indicates if it has remained in a test mode.

Figure 9:
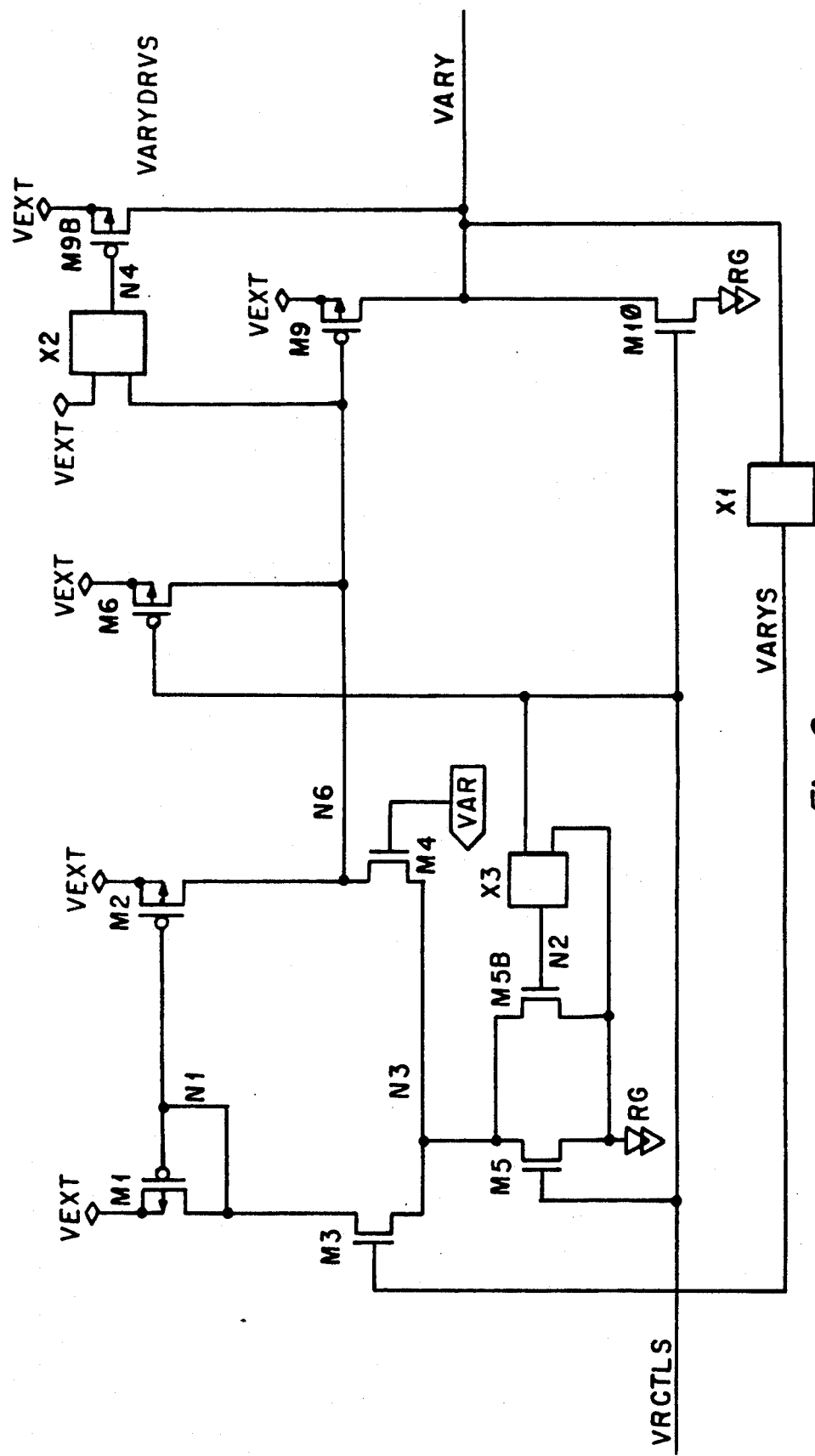
FIG. 9 illustrates the Voltage Array Driver Standby Circuit VARYDRVS.

FIG. 9 illustrates the Voltage Array Standby Circuit, VARYDRVS. P-channel transistor M1 and N-channel transistor 86:M3 are connected in series respectively between VDD and Node 86:N3. P-channel transistor 86:M2 and N-channel transistor 86:M4 are connected in series respectively between VDD and Node 86:N3. The gates of P-channel transistors 86:M1 and 86:M2 are connected together and connected to the series connection between 86:M1 and 86:M3. The gate of 86:M3 is connected to Node 86:VARYS. The gate of 86:M4 is connected to VAR. Node N3 is coupled to VSSRG through parallel connected N-channel transistors M5 and M5B. The gate of M5 is connected to VRCTLS. The gate of M5B is connected to the common terminal of SWITCH X3. The A terminal of X3 is connected to VSSRG. The B terminal of X3 is connected to VRCTLS.

In FIG. 9, P-channel transistor M6 is connected between external VDD and the series connection between transistors M2 and M4 at Node N6. The gate of transistor M6 is connected to VRCTLS. P-channel transistor M9 and N-channel transistor M10 are connected in series respectively between VDD and VSSRG. The gate of transistor M9 is connected to Node N6. The gate of transistor M10 is connected to VRCTLS. The series connection between transistors M9 and M10 is connected to the output VARY and to one terminal of SWITCH X1. The other terminal of SWITCH X1 is connected to Node VARYS. The B terminal of SWITCH X2 is connected to Node N6. The A terminal of X2 is connected to VDD. The common terminal of SWITCH X2 is connected to the gate of P-channel transistor M9B. Transistor M9B couples VDD to the output VARY.

Figure 10:
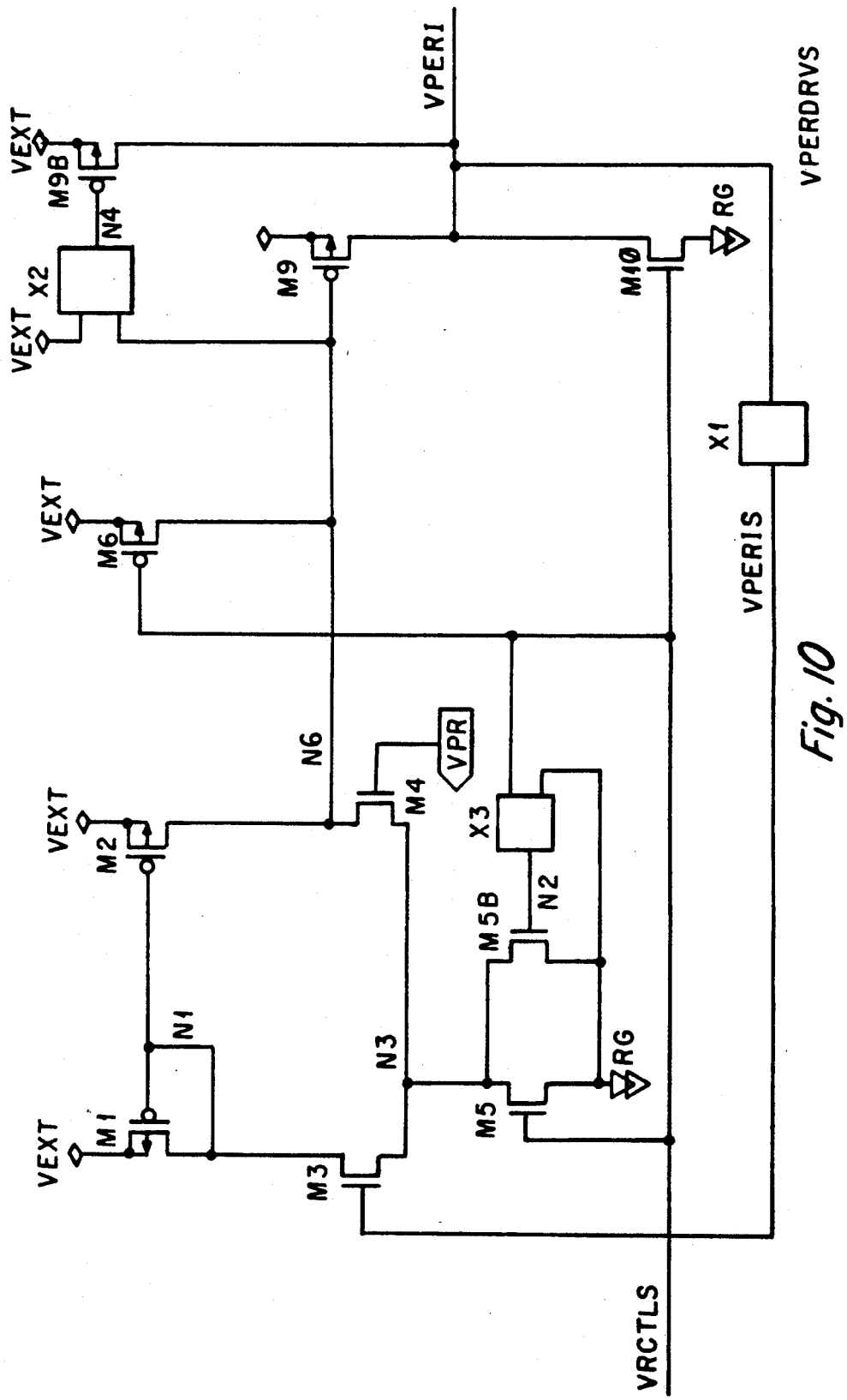
FIG. 10 illustrates the Voltage Periphery Driver Standby Circuit VPERDRVS.

FIG. 10 illustrates the Voltage Periphery Driver Standby Circuit, VPERDRVS. P-channel transistor M1 and N-channel transistor M3 are connected in series respectively between VDD and Node N3. P-channel transistor M2 and N-channel transistor M4 are connected in series respectively between VDD and Node N3. The gates of P-channel transistors M1 and M2 are connected together and connected to the series connection between M1 and M3. The gate of M3 is connected to Node VPERIS. The gate of M4 is connected to VPR. Node N3 is coupled to VSSRG through parallel connected N-channel transistors M5 and M5B. The gate of M5 is connected to VRCTLS. The gate of M5B is connected to the common terminal of SWITCH X3. The A terminal of X3 is connected to VSSRG. The B terminal of X3 is connected to VRCTLS.

In FIG. 10, P-channel transistor M6 is connected between VDD and the series connection between transistors M2 and M4 at Node N6. The gate of transistor M6 is connected to VRCTLS. P-channel transistor M9 and N-channel transistor M10 are connected in series respectively between VDD and VSSRG. The gate of transistor M9 is connected to Node N6. The gate of transistor M10 is connected to VRCTLS. The series connection between transistors M9 and M10 is connected to the output VPERI and to one terminal of SWITCH X1. The other terminal of SWITCH X1 is connected to Node VPERIS. The B terminal of SWITCH X2 is connected to Node N6. The A terminal of X2 is connected to VDD. The common terminal of SWITCH X2 is connected to the gate of P-channel transistor M9B. Transistor M9B couples VDD to the output VPERI.

Figure 11:
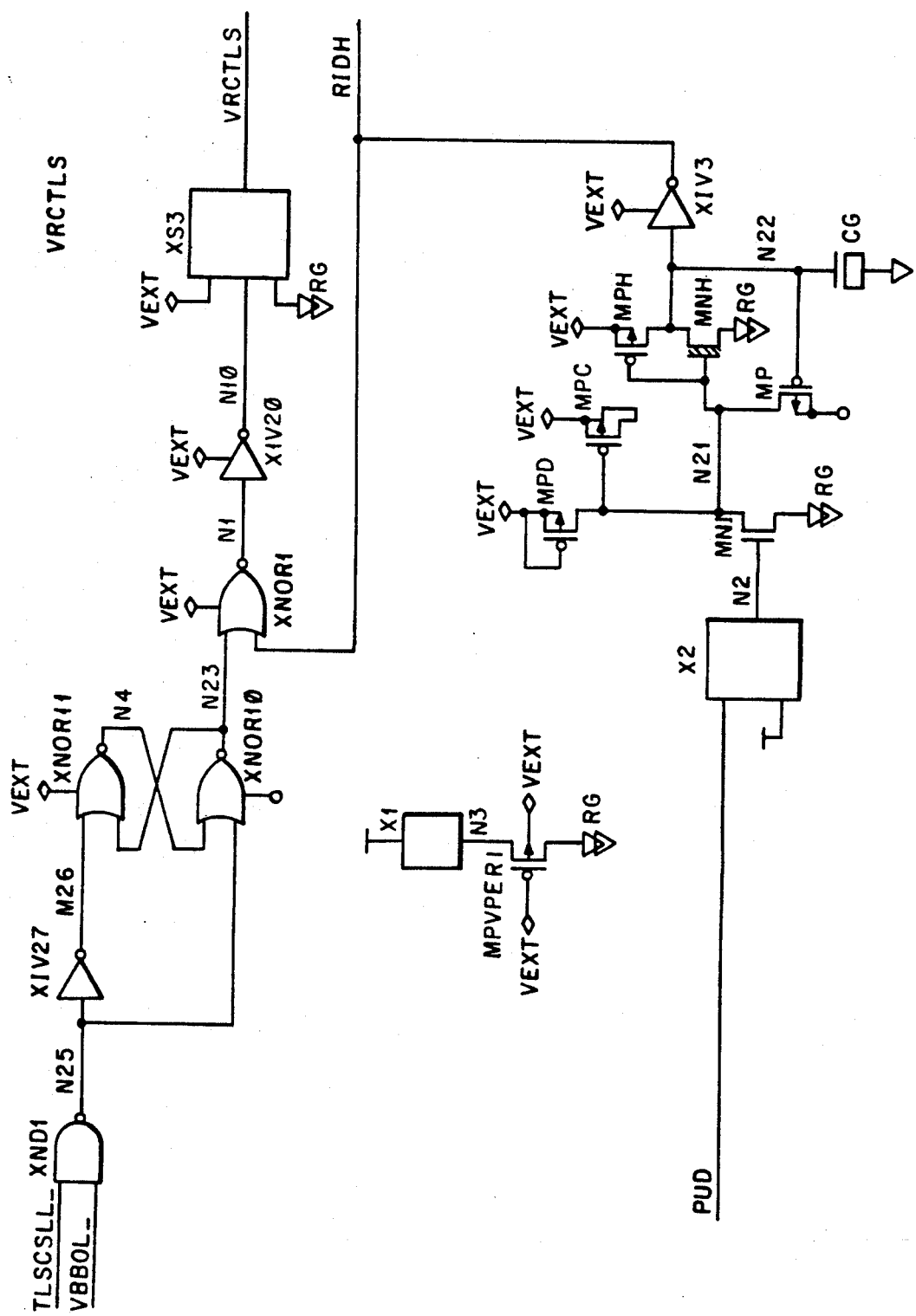
FIG. 11 illustrates the Voltage Regulator Control Logic for Standby Circuit VRCTLS.

FIG. 11 depicts the Voltage Regulator Control Logic For Standby circuit, VRCTLS. Input PUD is connected to the A terminal of SWITCH X2. The B terminal of SWITCH X2 is connected to VPERI. The common terminal of SWITCH X2 is connected to the gate of N-channel transistor MN1. N-channel transistor MN1 couples Node N21 to VSSRG. One terminal of transistor MPD is coupled to Node N21. The other terminal of transistor MPD is connected to the gate of MPD and connected to VDD. The gate of transistor MPC is connected to Node N21. The source and drain of transistor MPC is connected to VDD.

In the Voltage Regulator Control Logic For Standby, VRCTLS circuit of FIG. 11, P-channel transistor 88:MP couples Node N21 to external VDD. The gate of transistor MP is connected to Node N22. Node N22 is connected to one terminal of capacitor CG. The other terminal of capacitor CG is connected to VSS. P-channel transistor MPH and low threshold voltage N-channel transistor MNH are connected in series and biased respectively between VDD and VSSRG. Their gates are connected to Node N21. Their series connection is connected to Node N22. Node N22 is connected to the input of the inverter XIV3. Inverter XIV3 is biased by VDD. The output of Node XIV3 is connected to RIDH.

In the Voltage Regulator Control Logic For Standby circuit, VRCTLS of FIG. 11, signals TLSCSLL_ and VBBOL_ are connected to NAND gate XND1. The output of NAND gate XND1 is connected to an input of NOR gate XNOR10 and is coupled through inverter XIV27 to the first input of NOR gate XNOR11. The output of NOR gate XNOR10 is connected to the input of NOR gate XNOR11 and the output of NOR gate XNOR11 is connected to the first input of NOR gate XNOR10. NOR gates XNOR10 and XNOR11 are biased by VDD. The output of NOR gate XNOR10 is connected to the first input of NOR gate XNOR1. The other input of NOR gate NOR1 is the signal RIDH. The output of NOR gate XNOR1 is coupled through inverter XIV28 to the B terminal of the SWITCH XS3. Both NOR gate XNOR1 and inverter XIV28 are biased by VDD. The A terminal of SWITCH XS3 is connected to VDD. The C terminal of SWITCH XS3 is connected to VSSRG. The common terminal of SWITCH XS3 is connected to VRCTLS. P-channel transistor MPVPERI has its gate connected to VDD, the transistor is coupled between node N3 and voltage VSSRG. The substrate is connected to VDD. Switch X1 connects node N3 to voltage VPERI.

INTERNAL VOLTAGE SUPPLIES

Unlike previous DRAM generations, the 16 meg regulates its internal voltage supplies. This is with the consideration for device power dissipation, memory cell signal charge, device reliability and user preference of maintaining external voltage of 5V nominal.

There are 3 regulated voltage levels within the 16 meg DRAM. First, the periphery voltage, VPERI. This is a 4V level that goes to the power line for majority of the periphery circuitry. Next, the array voltage, VARY. VARY is the storage cell and the sense amplifier operating voltage. This is regulated to 3.3V. The last regulated voltage level is the bitline reference, VBLR and the top plate voltage, VPLT. These 2 voltage levels are half of the array voltage, about 1.65V. They are generated in the following manner.

First, a reference voltage level, VREF is generated with the Bandgap Reference generator. This is a 1.2 V level. From there, it is multiplied to 3.0 V, VARP and 4.0 V, VPRP. But these levels do not have high driving capability. Furthermore, to prevent having large metal busses on the chip to carry these supplies to on chip circuitry, drivers are located strategically near the required circuitry. Thus, to resolve this, VARP and VPRP are buffered to get VAR and VPR respectively. These two voltage levels are then channelled to the drivers which are located near their circuitries. The drivers output are the VPERI and VARY. Lastly, VBLR and VPLT are generated by dividing the VARY into half.

There are 2 types of drivers in the chip, i.e. the main drivers and the standby drivers. During standby mode, only the standby drivers are active. These provide the leakage current. In active cycle, both the standby and main drivers are active.

VBNDREF

Figure 2:
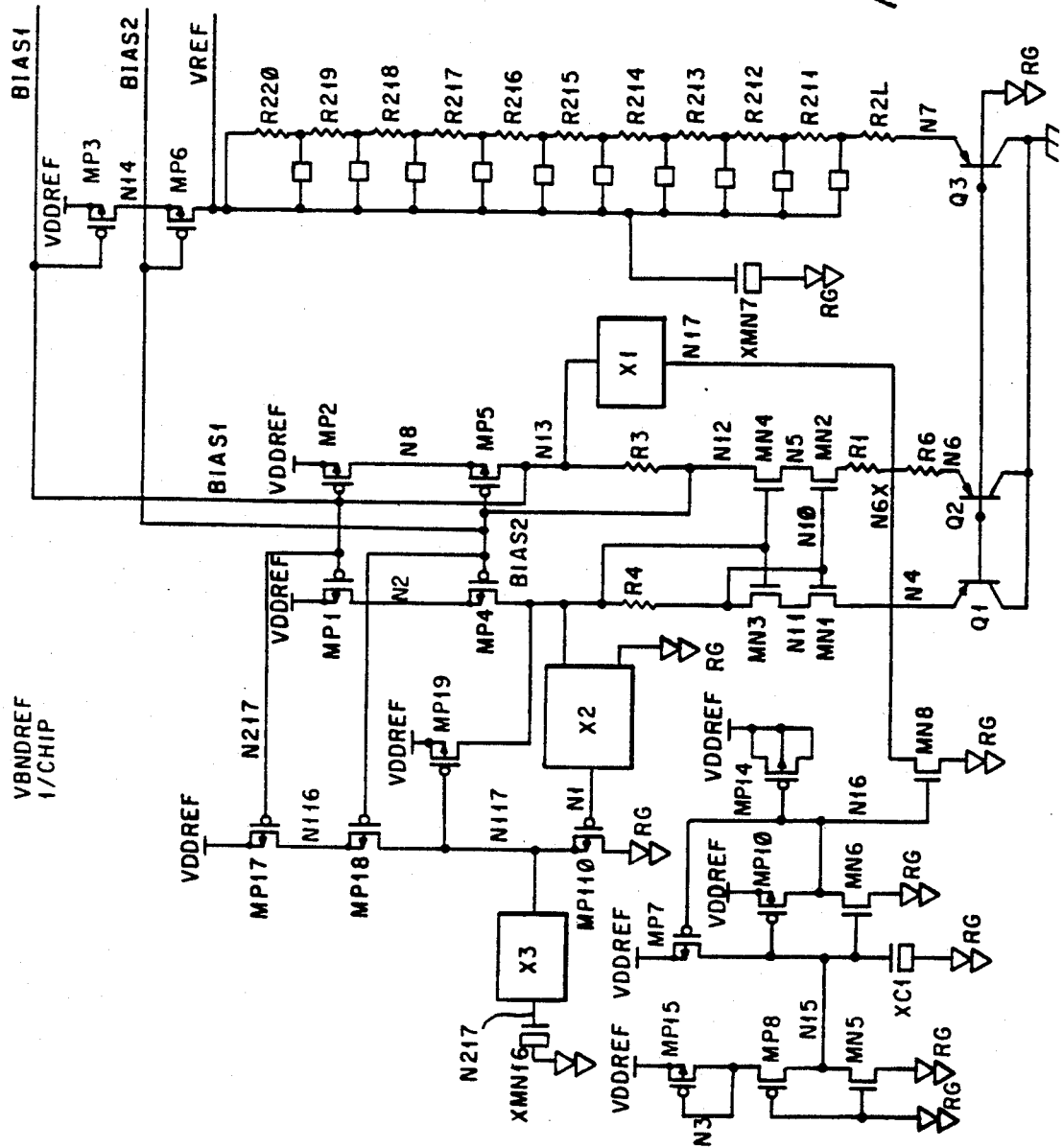
FIG. 2 illustrates the Voltage Bandgap Reference Generator Circuit VBNDREF.

VOLTAGE BANDGAP REFERENCE GENERATOR schematic FIG. 2

Voltage Regulation

This circuit generates a reference voltage. Besides providing a stable voltage, it is designed to have immunity towards changes in temperature. A standard BANDGAP REFERENCED BIASING circuit is improved to achieve this.

The Bandgap Referenced Biasing circuit is comprised of transistors, MP1 through MP6, MN1 through MN4 and Q1 through Q3. Constant current that flows along the 3 electrical path is governed by the equation;

$$i = \frac{VT * \ln(\text{emitter area } Q2/\text{emitter area } Q1)}{\text{Resistance, } R1}$$

; where $VT$ is the thermal voltage

; the 3 paths mentioned are:-
- $MP1$ to $Q1$.
- $MP2$ to $Q2$.
- $MP3$ to $Q3$.

With this constant current, the output voltage, VREF is obtained by the summation of potential drops across resistor R2 and across emitter-base of Q3.

$$\begin{aligned} VREF &= (i * R2) + Vbe \\ &= (VT * \ln 8 * R2/R1) + Vbe \end{aligned}$$

; where ratio of emitter area of $Q2$ to $Q1$ is 8.

Here, a regulated voltage is achieved, i.e. VREF does not depend on the external voltage. But note that the parameters that generate VREF are temperature dependent parameters. Thus, VREF changes with temperature.

Knowing that Vb has negative temperature coefficient while Vt and R2 and R1 have positive temperature coefficient, simulations were made to obtain R1 and R2 such that the resultant change in VREF due to temperature is zero. R1 is first determined by fixing the constant current to the region of 0.5 uA. Through simulation, the operation of VREF is to be 1.2 V and R1 and R2 are to be 5.4K ohms and 51.3K ohms respectively.

To achieve a wider operating range, another modification was made on the standard circuit. The new circuit is designed to start its voltage regulation of a Vt lower than the standard circuit.

Note that, for a transistor to operate in its saturation region, the following condition needs to be satisfied;

$$/Vds/ \text{ greater or equal to } /Vgs-Vt/$$

In the standard circuit, the gates of a p-ch and n-ch transistors are tied to the drain, thus forcing the device into its saturation region, (here $/Vds/ > /Vgs-Vt/$), when Vds reaches active Vgs level. But for the device to be in saturation, Vds needs only to be at a lower value, i.e. $/Vds/=Vgs-Vt/$.

So instead of tying the gate to the drain, the gate is tied to a point of magnitude that is about one Vt potential above the drain potential. Hence the device is activated into its saturation region as Vgs is activated with Vds is one Vt below Vgs. Thus, the device is operationable at a lower voltage level.

That is the reason that in the Bandgap Referenced Biasing circuit, gate of MP1/MP2 is tied to drain of MP5, gate of MN1/MN2 is tied to drain of MN3, gate of MN4/MN5 tied to drain of MP4 with R4 to provide to potential drops, and gate of MP4/MP5 tied to drain of MN4 with R3 to provide the potential drops.

If the external voltage is too low, the transistors in the Bandgap Referenced Biasing are inactive. Thus there will not be any output voltage at VREF. But we would like to have some small signal level at the output and require it to increase gradually as the external voltage increases. To achieve this, two low voltage starter circuits are incorporated into the design.

The first low voltage starter drives current into R4 and then the drain of MN3 at low external voltage. This circuit is comprised of MP17, MP18, MP19, MP110 and MN16. At low external voltage, with MP17 and MP18 off, current is driven into node N13 through MP19 with MN16 keeping node N117 low. MP110 is used to discharge capacitor MN16 when the external supply goes too low. But when the external voltage is sufficient to turn on the Bandgap Referenced Biasing transistors, MP17 and MP18 are turn on, thus charging up MN16 and turning off MP19. This allows the normal biasing mode to operate.

The second low voltage starter sinks current from the drain of MP5. At low voltage startup, C1 keeps N15 low, thus turning on MP10 and MN8. This helps to switch on MP5 and MP2. By doing so, it forces current to flow in them.

With the current generated by the above two circuits, the current mirror effect takes place and generates current into R2. This provides the voltage at VREF. Note, that this is not a regulated voltage.

Besides generating the VREF, two other signals are routed for use to on other circuits. They are the BIAS1 and BIAS2 signals. They are used to generate a similar current flow in other circuits through the current mirror effect.

Capacitor MN7 serves as a stabilizer for VREF.

VMULT

Figure 3:
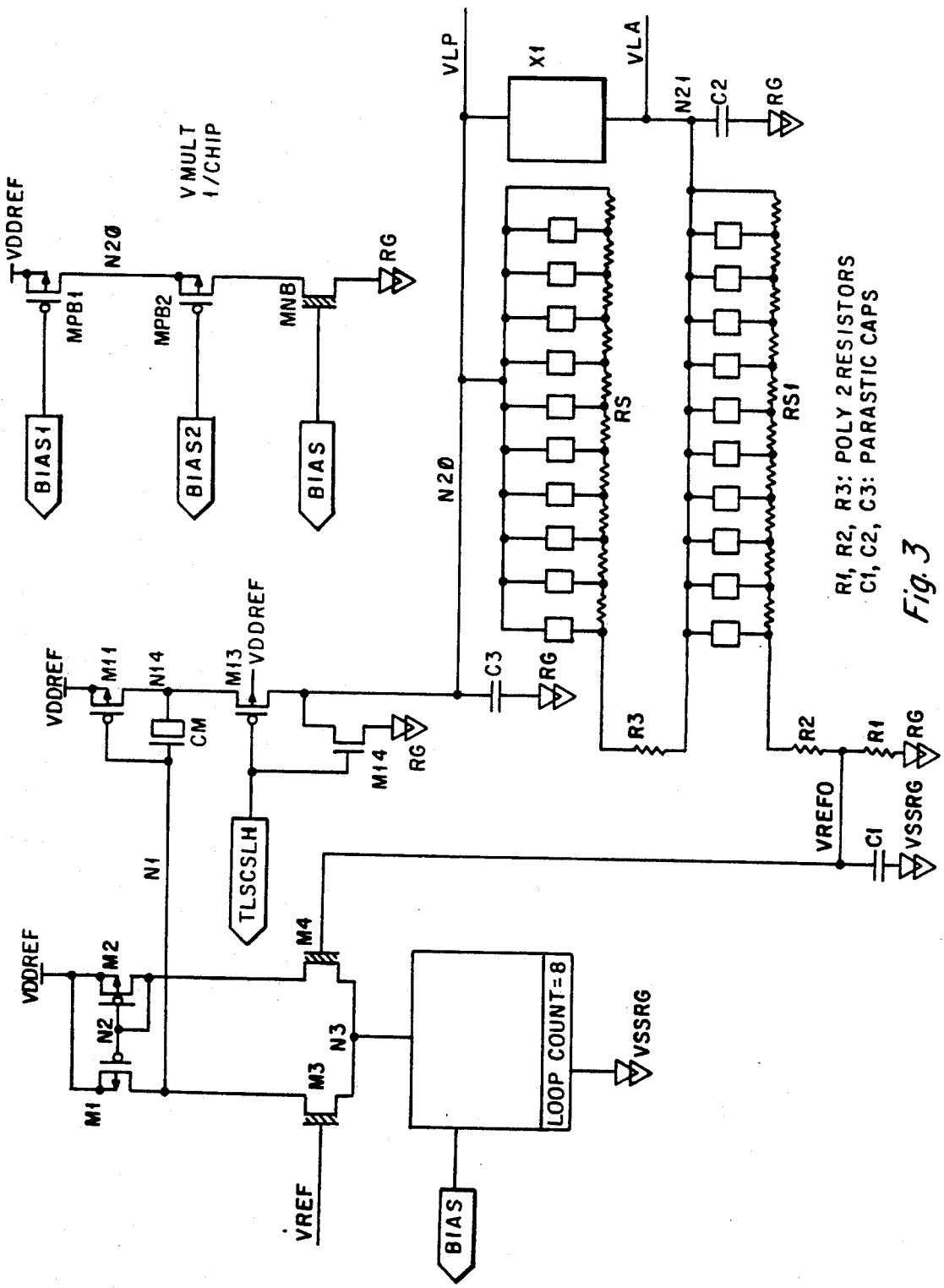
FIG. 3 illustrates the Voltage Multiplier Circuit VMULT.

VOLTAGE MULTIPLIER schematic FIG. 3

From VBDNREF, we have a regulated voltage of 1.2 V. To get the required voltage level of 3.3 V and 4 V, VMULT uses the concept of a potential divider to multiply VREF to the required voltage levels.

By using BIAS1 and BIAS2, a constant current source is generated at node N3 of the source coupled pair, M3 and M4. The gate of M3 is connected to VREF, and the gate of M4 is connected to node VREF0 of a series of resistors. This source couple pair compares the voltage VREF and VREF0. Differential voltages cause different current flows in M3 and M4, thus varying the potential at node N1. For example, as VREF goes higher, current at node N1 increases. As the current increases, the voltage at N1 drops lower. Node N1 is used as feedback to correct the potential at VREF0. As potential N1 drops, potential at VREF0 increases with a lower N1 signal at M11. Besides this feedback mechanism, there is this current mirror configuration on the drain of M3 and M4. With this current mirror, it will try to maintain the same current flowing through M3 and M4, thus maintaining the same current. The circuit maintains VREF0 to equal to VREF.

With VREF0 maintained at VREF, and current through R1, R2 and R3 the same, we have a voltage multiplier circuit, where the output voltages are:

$$Vla=\{(R1+R2)/R1\}*VREF0$$

$$Vlp=\{(R1+R2+R3)/R1\}*VREF0.$$

R2 and R3 are trimble resistors in order to achieve the required levels of 3.3 V and 4 V. Capacitor CM is to provide damping to the feedback node N1.

If the device is operating in DFT CELL STRESS mode, active TLSCSLH shuts off the supply line for the voltage multiplier and grounds it. Thus both outputs VPRP and VARP will be at GND level.

VLMUX

Figure 4:
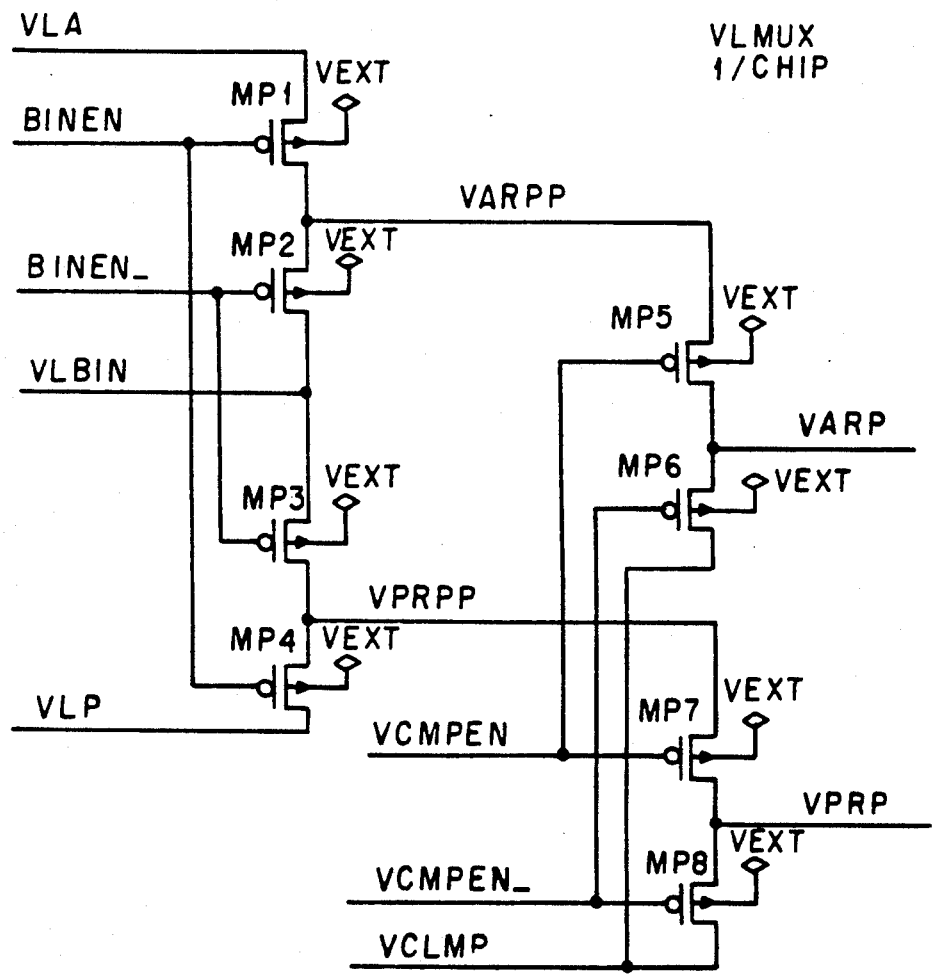
FIG. 4 illustrates the Voltage Level Multiplier VLMUX.

VOLTAGE LEVEL MULTIPLEXER schematic FIG. 4

Let's recap what we have gone through. First, we generated two regulated voltage levels, VLA and VLP. Next, a burn in voltage is generated. This is a voltage level 2 Vtp below the external voltage level. Finally, the clamp voltage of about 7.3 V is generated. Thus we have 3 sets of voltage level, but the device only operates one set.

VLMUX does the selection of the set of voltage to be used in the device. In the device, when the external voltage is below 6.5 V, the regulated levels, VLA and VLP serve as the internal supply level. But as it goes above 6.5 V, active BINEN and BINEN_ multiplex the the internal level to be the burn in level. Note that both the array and periphery are at the same voltage level during the burn in region. During switching from the regulated voltage level to the burn in voltage level, there will be a sudden jump in the voltage level for both the array and periphery voltage.

Next, as the external voltage goes beyond 9.5 V, another switching of the voltage level occurs. Here, active VCMPEN and VCMPEN__ activates the switch from the burn in voltage level to the clamp level. As the clamp level is designed to be the same as the burn in level at the switch point, the transfer of internal voltage supply should be a smooth transfer. But if there is any mismatch between the clamping voltage level and the burn in voltage level, during the transfer, a small voltage jump may be observed.

From here the output, VARY and VPRP goes to the next stage, i.e. the VARYBUF and VPERBUF and drivers before supplying the circuit.

VARYBUF

VOLTAGE ARRAY BUFFER

VPERBUF

Figure 5:
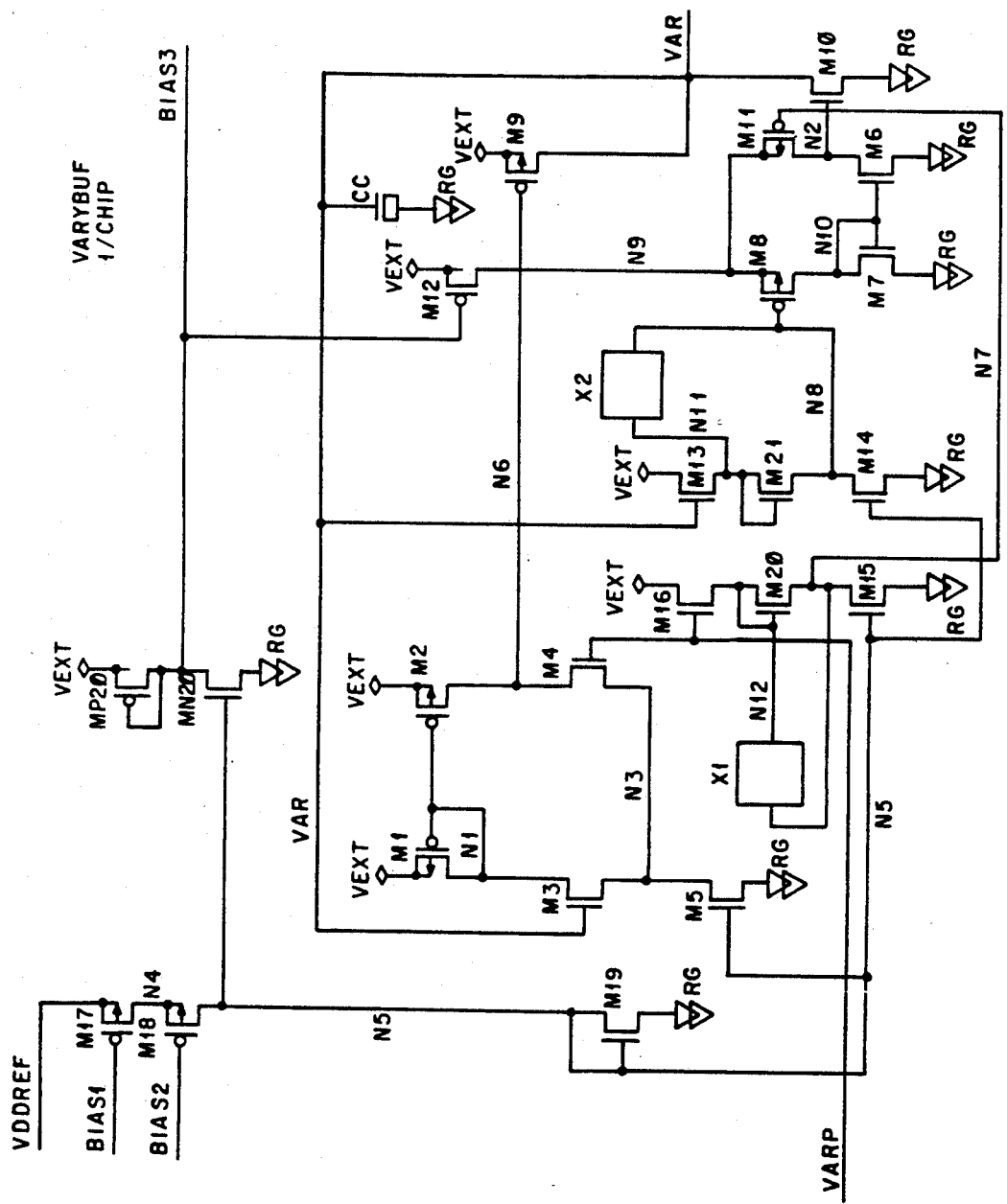
FIG. 5 illustrates the Voltage Array Buffer Circuit VARYBUF.
Figure 6:
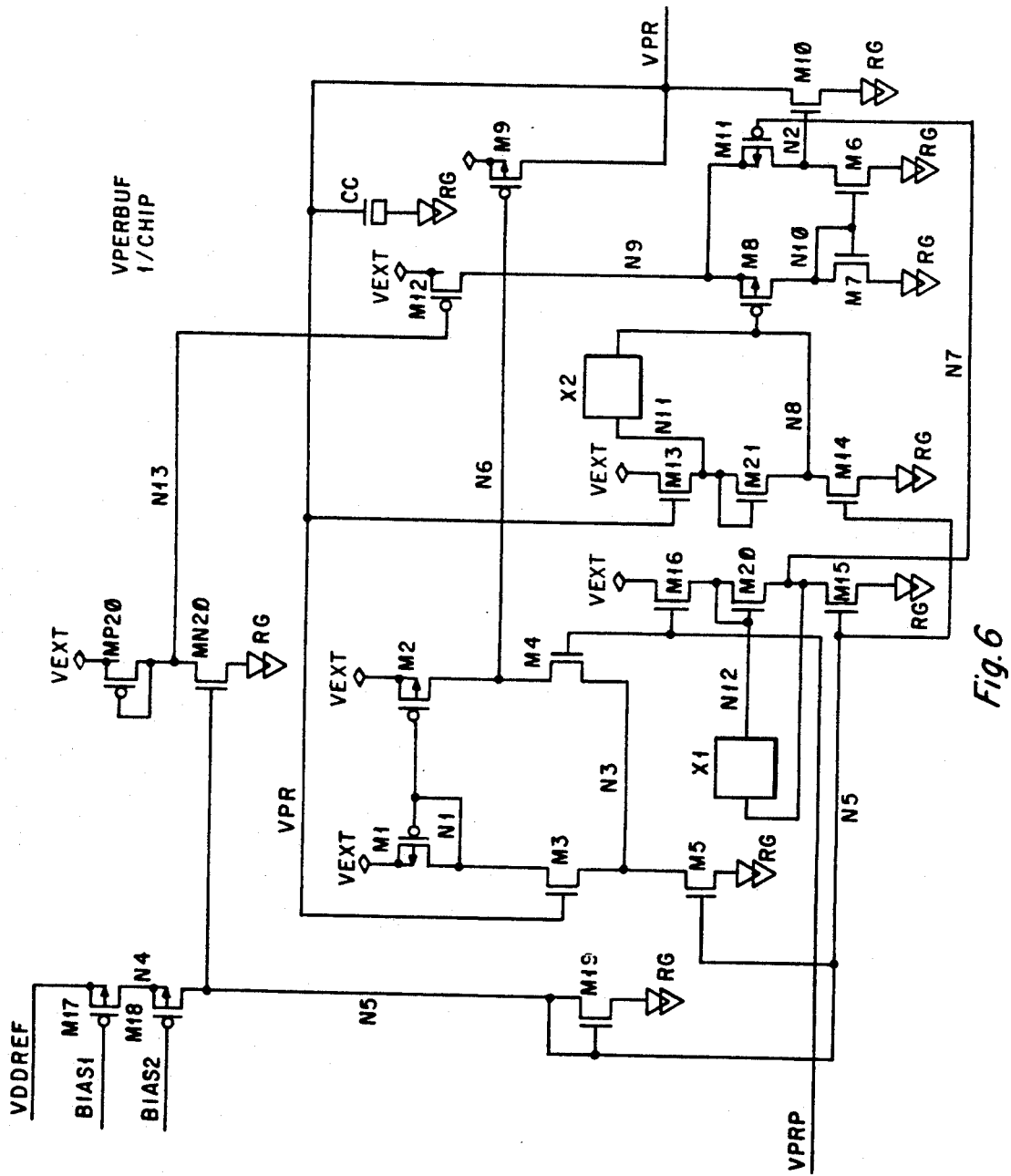
FIG. 6 illustrates the Voltage Periphery Buffer Circuit VPERBUF.

VOLTAGE PERIPHERY BUFFER schematic FIG. 5 and FIG. 6

These two circuits serve as an intermediate stage between the regulated voltage from VMULT and the actual drivers that provide current to the circuits. These buffers are located near VMULT and provide just enough power to drive the drivers.

VARYBUF and VPERBUF circuits are exactly the same circuit except for the setting in the level shifter. They are unity gain amplifiers. The amplifier is a two stage CMOS operational amplifier with a class B output stage. Transistors at the output stage are controlled by two sets of complimentary source follower pairs. The constant current sources at the two source follower pairs are generated through transistor M5 and M12 with the signal BIAS1 and BIAS2 controlling them.

To get a unity gain, the output VAR or VPR is feedback to the 'Inverting Terminals' of the amplifier. The inverting terminals are gates of M3 and M8. Note that the 'Noninverting terminals' are gates of M4 and M11. The noninverting terminals of the amplifier are connected with the output from VMULT, i.e. VARP or VPRP.

For the source couple pair, M6, M7, M8 and M11 note that inputs to the differential gates are shifted to a lower value before applying them. In VARYBUF, input voltages are shifted lower by a Vtn through M16 and M13. As for VPERBUF, they are shifted by 2 Vtn through M16/M20 and M13/M21. The reason for this level shifting are as follows;

with active M8 and M11, node N9, source of the 2 transistors is a Vtp above the gates level.

thus, without level shifting, N9 of VARYBUF will be (3.3 V+Vt), about 4.4 V and N9 of VPERBUF will be (4 V+Vt), about 5.1 V.

for M12 to be in saturation region, in order to operate as current source, it has to satisfy the following condition;

/Vds/ greater or equal to /Vgs−Vt/ i.e., the potential drops from external voltage to N9 must be greater than or equal to the magnitude of potential difference between M12 Vgs and its Vtp. So for VARYBUF and VPERBUF to work, the external voltage has to be at least higher than 4.4 V and 5.1 V respectively, which is not acceptable. To resolve this, the level shifters are used to lower N9 operating potential.

As for the other set of source follower pair, the p-ch transistors do not face this problem. Hence, level shifter is not used here.

Capacitor, CC is used as oscillation damper.

VARYDRV

VOLTAGE ARRAY DRIVER

VPERDRV

Figure 7:
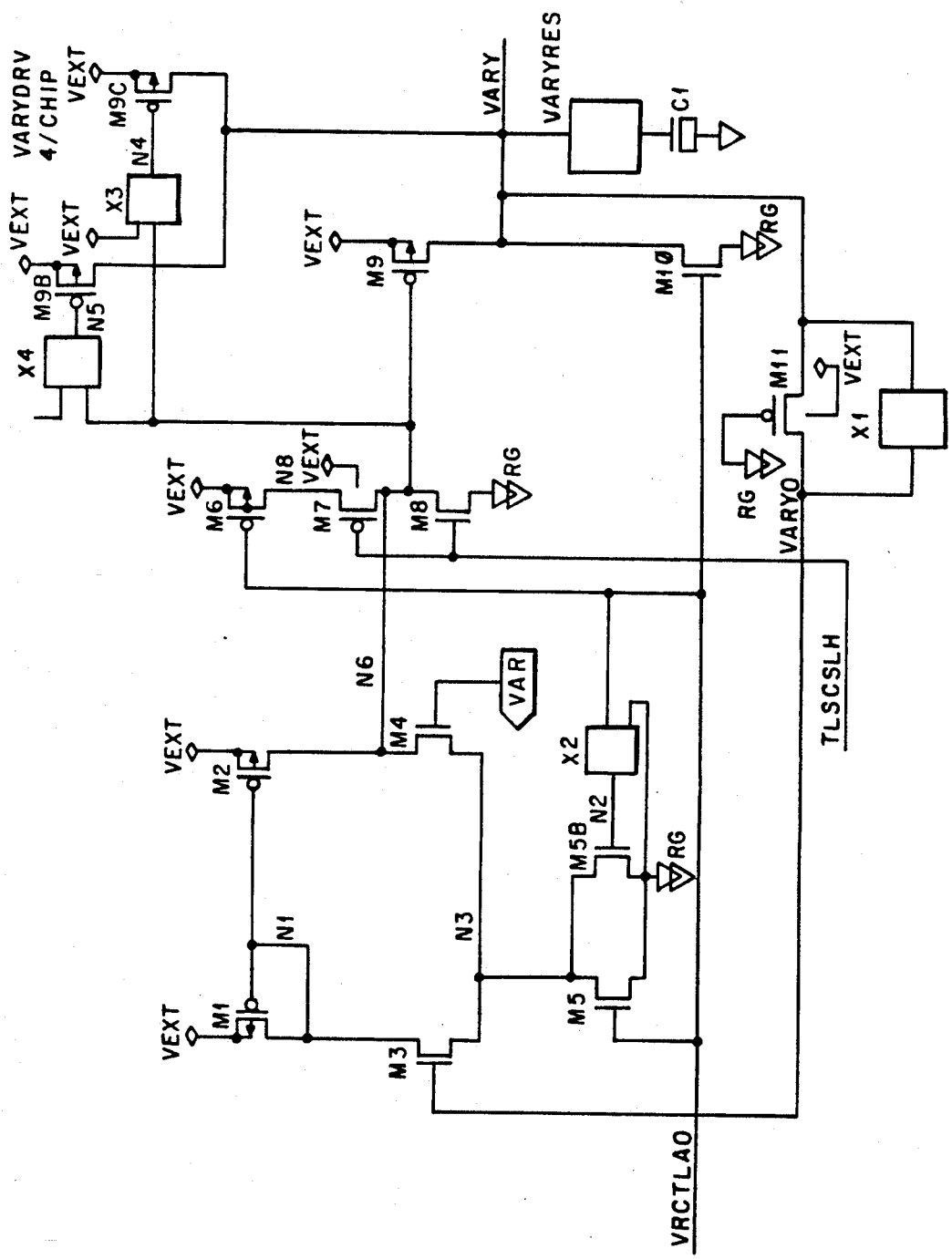
FIG. 7 illustrates the Voltage Array Driver Circuit VARYDRV.
Figure 8:
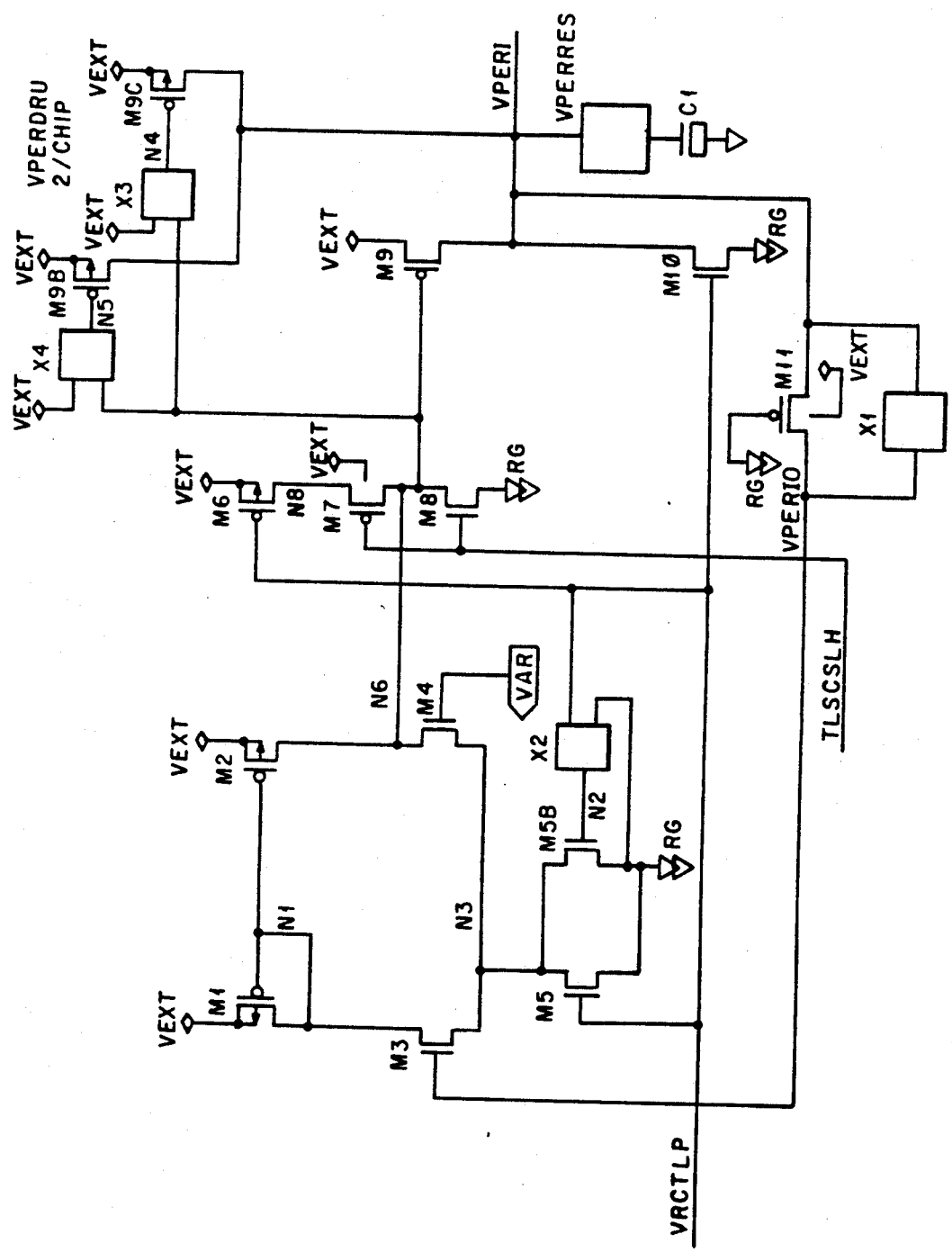
FIG. 8 illustrates the Voltage Periphery Driver Circuit VPERDRV.

VOLTAGE PERIPHERY DRIVER schematic FIG. 7 and FIG. 8

These are the main drivers for the device. There are 4 VARYDRVs. They provide the array voltage of 3.3 V to the array sense amplifiers. Two of them support quadrants Q0 and Q1, and the other 2 support Q2 and Q3. Each of these drivers drive supplies to either the left or right octant of two quadrants. As for, VPERDRV, there are two of them. They are for the various periphery circuits.

These drivers are constructed with CMOS differential amplifier with class A stage driver. The circuit is connected as a comparator in unity gain second, with a feedback from its output to its input terminal.

The variation of this circuit from the conventional circuit is that instead of using M5 and M10 merely as current source at the source couple pair and the output stage, they serve as control to enable or disable the drivers. The signal that is used to do this control is VRCTLAO for VARYDRV and VRCTLP for VPERDRV. Thus, with this control, only the necessary drivers are activated. Note that, if the drivers are left active, continuous current will flow to GND due to the class A output stage, which would increase standby current.

Under DFT, STORAGE CELL STRESS mode, active TLSCLSH signal isolates the 1st stage of the comparator, source couple pair, from its 2nd stage, output stage. At the same time, it fully switches on M9, thus forcing the driver output, VARY or VPERI to use the external voltage.

During the comparator analysis, the metal level, CUT POINT can be cut. By doing so, it open the feedback loop for AC signals. Thus allowing open loop analysis of the AC characteristic (bandwidth and gain) of the comparator.

R1 and C1 serve as damper for the output, VARY or VPERI.

VARYDRVS

VOLTAGE ARRAY DRIVER STANDBY

VPERDRVS

VOLTAGE PERIPHERY DRIVER STANDBY schematic FIG. 9 and FIG. 10

These circuits are the same as the main drivers except for the smaller transistor sizing and all the control is done at the current source transistors M5 and M10. It does not have an independent circuit for DFT, TLSCSLH signal to control the output stage. This DFT control is incorporated into the M5 and M10 switching. In this DFT mode, (Storage Cell Stress), the drivers are disabled. Hence only the main drivers are used to supply the external voltage to the device.

As in the main drivers, the feedback loop can be cut. This allows both open loop gain and open loop bandwidth to be determined.

There is one of each of these circuits on the device. They are used to supply leakage current to the device.

VRCTLS

VOLTAGE REGULATOR CONTROL LOGIC for STANDBY schematic FIG. 11

VRCTLS is the signal that controls the operation of both standby drivers. The standby drivers are active all the time except for DFT, Storage Cell stress operation and during latchup, i.e., when VBB goes to 0 V.

At powerup, node N22 of capacitor CG remains low while node N21 with capacitor MPC tracks the external voltage. Thus RIDH is set to logic '1' and it tracks the external voltage even after N21 goes high and N22 goes low, with CG being charged up. As RIDH tracks the external voltage, it enables the standby drivers with active VRCTLS. This logic '1' RIDH signal also disables the output of 'Vbb ZERO LEVEL DETECTOR' to be used as latchup signal, during power up, while the VBB level is still at 0zero volts.

But, as the external voltage reaches about 2 V, PUD goes to logic '1', thus returning RIDH to logic '0'. This passes the control of VRCTLS to the status of TLSCSLL_ and VBBOL_. These are status of DFT, Storage Cell Stress test and latchup. Normally, VRCTLS stays active unless either TLSCSLL_ or VBBOL_ is active. Besides, with RIDH at logic '0', it allows the output of VBB ZERO LEVEL DETECTOR to be the indicator of latchup.

Note the part of the circuit that generates the signal RIDH. A CMOS inverter, P-channel pull up transistor MPH and N-channel pull down transistor MNH, is biased between the external voltage and ground. The input of the CMOS inverter can be coupled to the internally generated voltage VPERI through the gate of the N-channel pull down transistor MNI to terminal B of the switch X2. P-channel transistor MPC, having its source and drain coupled together and to the external voltage, acts as a capacitor to couple the input of the CMOS inverter to the external voltage. Capacitor CG has one terminal connected to the output of the CMOS inverter and the other terminal connected to ground. Transistor MPD, having its gate and source connected to the external voltage and its drain connected to the input of the CMOS inverter acts as a reverse bias leakage diode.

The gate of P-channel pull up transistor MP is connected to the output of the CMOS inverter. The source of the transistor is connected the external voltage and its drain is connected to the input of the CMOS inverter. The relative sizes of N-channel transistor MNI P-channel transistor MP determine the trip point of the CMOS inverter. Inverter XIV3 buffers the output of the CMOS inverter.

The portion of the VRCTLS circuit functions as a power up reset circuit for the DRAM of FIG. 1 containing the on chip voltage generator previously described. The CMOS inverter is powered by external Vdd. N-channel transistor MNI couples the internal voltage to the input of the CMOS inverter. P-channel transistor MP is controlled by the output of the inverter. It couples external Vdd to the input of the CMOS inverter during slow power ramp up conditions. The capacitor formed by the transistor MPC couples Vdd to the input of the CMOS inverter during fast power ramp up. The reverse biased leakage diode formed by the transistor MPD also couples external Vdd to the input of the CMOS inverter during slow power ramp up.

The circuit generates a positive going pulse when the external power supply ramps up. The pulse disappears when the voltage level within the DRAM, VPERI, reaches a predetermined value of the external supply voltage. The trip point of the circuit with respect to the external supply voltage may be adjusted by varying the relative sizes of N-channel pull down transistor MNI and P-channel pull up transistor MP.

The disclosed power up reset pulse generator circuit generates a positive going pulse when the external power supply ramps up. The pulse disappears when the voltage level within the memory device reaches a predetermined value of the external supply voltage. The circuit includes a CMOS inverter that is biased between the external voltage and ground and has its input coupled to the internally regulated voltage. The gate of a pull down transistor may couple the input of the CMOS inverter to the internally regulated voltage. A pull up transistor that is biased by the external voltage and whose gate is connected to the output of the CMOS inverter, is connected to the input of the CMOS inverter. Other elements may be added to enhance the circuits performance. The trip point of the circuit with respect to the externally supplied voltage may be adjusted by varying the relative sizes of the pull down transistor and the pull up transistor.

It advantageously provides a reset signal for use in bringing a semiconductor device into a stable mode of operation as power is applied, without necessity for any control from an external device, thereby reducing the need for input pins and improving the reliability of the semiconductor device. It provides a reset signal so that various circuits of the device power up in a known condition.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modification or embodiments as fall within the true scope of the invention.

What is claimed is:

1. An integrated circuit to generate a power up reset pulse for a semiconductor device having an on chip voltage generator that receives external voltage and produces internal voltage comprising:
    a CMOS inverter biased between the external voltage and ground, having an input and an output, the input coupled to the internal voltage by pull down transistor having a gate connected to the internal voltage; and
    a pull up transistor connected to the input of the CMOS inverter, having a gate connected to the output the CMOS inverter, biased by the external voltage; and
    a capacitive means for coupling the input of the CMOS inverter to the external voltage.

2. The circuit of claim 1 wherein the capacitive means is a P channel transistor having its gate connected to the input of the CMOS inverter and its source and drain connected to the external voltage.

3. The circuit of claim 1 further comprising a capacitor having one terminal connected to the output of the CMOS inverter and the other terminal connected to ground.

4. The circuit of claim 1 further comprising reverse bias leakage diode coupling means for coupling the input of the CMOS inverter to the external voltage.

5. The circuit of claim 4 wherein the reverse bias leakage diode coupling means is a P channel transistor having its drain connected to the input of the CMOS inverter, and having its gate, source, and substrate connected to the external voltage.

6. The circuit of claim 4 further comprising a buffer biased by the external voltage having its input connected to the output of the CMOS inverter.

7. A circuit for generating an enable signal responsive to a voltage produced by an on chip voltage generator circuit during power up comprising:
- a first N channel transistor of a predetermined size connected to a first node, having its gate connected to the voltage produced by the on chip voltage generator circuit;
- a first P channel transistor of a predetermined size having its source connected to an external voltage, its drain connected to the first node, and its gate connected to a second node;
- a CMOS inverter, having a P channel transistor biased by the external voltage, having a low threshold voltage N channel transistor connected to ground, the CMOS inverter having an input connected to the first node and an output connected to the second node, and further having a trip point;
- a capacitor connected to the second node to couple the second node to ground; and wherein the trip point of the CMOS inverter is determined by the relative sizes of the first N channel transistor and the first P channel transistor.

8. The circuit of claim 7 further comprising:
- a capacitor connected to the first node to couple the first node to the external voltage.

9. The circuit of claim 8 wherein the capacitor is formed of a P channel transistor having its gate connected to the first node, and having its drain and source connected to the external voltage.

10. The circuit of claim 9 further comprising:
- an inverter having an input connected to the second node to buffer the output of the CMOS inverter.

11. A power up reset circuit for a dynamic random access memory device containing an on chip voltage generator that produces an internal voltage in response to receiving external Vdd voltage, comprising:
- a CMOS inverter powered by Vdd, having an input and an output;
- a transistor, connected to the input of the CMOS inverter and connected to an internal voltage, to couple the internal voltage to the input of the inverter;
- a transistor controlled by the output of the inverter to couple Vdd to the input of the inverter during slow power ramp up; and
- a capacitor to couple Vdd to the input of the CMOS inverter during fast power ramp up.

12. The power up reset circuit of claim 11 further comprising:
- a reverse biased leakage diode to couple Vdd to the input of the CMOS inverter during slow power ramp up.

13. The power up reset circuit of claim 12, further comprising:
- an inverter having an input connected to the output of the CMOS inverter to buffer the output of the CMOS inverter.

* * * * *